US006482570B1

(12) United States Patent
Hotta

(10) Patent No.: US 6,482,570 B1
(45) Date of Patent: Nov. 19, 2002

(54) METHOD FOR PRODUCING LITHOGRAPHIC PRINTING PLATE

(75) Inventor: Hisashi Hotta, Shizuoka (JP)

(73) Assignee: Fuji Photo Film Co., Ltd., Minami-Ashigara (JP)

(*) Notice: Subject to any disclaimer, the term of this patent is extended or adjusted under 35 U.S.C. 154(b) by 0 days.

(21) Appl. No.: 09/549,950

(22) Filed: Apr. 14, 2000

(30) Foreign Application Priority Data

Apr. 15, 1999 (JP) .......................................... 11-108145

(51) Int. Cl.[7] .................................................. G03F 7/07

(52) U.S. Cl. .................. 430/302; 430/273.1; 430/275.1

(58) Field of Search ............................. 430/302, 273.1, 430/275.1

(56) References Cited

U.S. PATENT DOCUMENTS 5,868,074 A * 2/1999 Neifert et al. .............. 101/462
5,925,496 A * 7/1999 Ghosh et al. ............... 430/302
6,114,094 A * 9/2000 Ishiguro et al. ............. 430/302
6,145,565 A * 11/2000 Fromson et al. ............ 156/580
6,403,282 B1 * 6/2002 Mayers et al. .............. 430/204

FOREIGN PATENT DOCUMENTS

DE 19748711 A 5/1998
EP 0934824 A 8/1999
GB 2325886 A 12/1998
WO WO9850231 A 11/1998

* cited by examiner

*Primary Examiner*—Janet Baxter
*Assistant Examiner*—Yvette M. Clarke
(74) *Attorney, Agent, or Firm*—Burns, Doane, Swecker & Mathis, LLP

(57) ABSTRACT

A method for producing a lithographic printing plate which comprises imagewise irradiating a lithographic printing plate precursor with a laser beam to make the irradiated part hydrophilic, wherein the lithographic printing plate precursor comprises a metal compound selected from at least one metal element belonging to Group 4 to Group 6 of the Periodic Table and an oleophilic layer provided on the surface thereof.

3 Claims, No Drawings

METHOD FOR PRODUCING LITHOGRAPHIC PRINTING PLATE

FIELD OF THE INVENTION

The present invention relates to general printing field, especially a lithographic printing, and particularly a novel lithographic printing plate precursor capable of easily forming a printing plate. Above all, the present invention relates to a lithographic printing plate precursor capable of image recording by scanning exposure based on laser beams and also capable of being loaded on a printer as it is and printing without development.

BACKGROUND OF THE INVENTION

A lithographic printing plate generally comprises an oleophilic (ink receptive) image part which receives ink during printing and a hydrophilic (water receptive) non-image part which receives fountain solution. As such a lithographic printing plate precursor, a PS plate comprising a hydrophilic support having provided thereon an oleophilic photosensitive resin layer has so far been widely used. A plate-making method of a lithographic printing plate comprises, in general, performing exposure through the image of a lith film and the like and then dissolving and removing a non-image part with a developing solution to thereby obtain a printing plate.

The conventional plate-making process of a PS plate necessitates the operation of dissolution and removal of a non-image part after exposure, and as to the improvement of conventional techniques it has been desired to cease to use or simplify such an additional wet process. In particular in recent years, since the disposal of waste solutions which are discharged as a result of the wet process has become a great concern in the industry at large from the standpoint of global environmental protection, there is an increased demand for the improvement in this aspect.

As one simple plate-making method which meets the above demand, there has been suggested a method of using an image-recording layer by which the removal of the non-image part of a printing plate precursor can be performed in general printing process, and effecting development after exposure-on a printer, to thereby obtain a final printing plate. A system of plate-making of a lithographic printing plate by such a method is called a development-on-machine system. Specifically, for example, a method of using an image-recording layer soluble in a fountain solution and an ink solvent, and a method of conducting mechanical removal of a non-image part by contact with the impression cylinder and the blanket cylinder in a printer can be exemplified. However, a big problem of the development-on-machine system is that complicated means should be taken such that a printing plate precursor must be stored under a completely light-shielded state or under a constant temperature condition after exposure during the period of time until the printing plate is loaded on a printer because an image-recording layer is not fixed.

On the other hand, as another trend in this field, digitized techniques of electronically processing, accumulating and outputting image data using a computer have prevailed, and various image output systems corresponding to these digitized techniques have been put to practical use. As one example of such techniques, a computer-to-plate technique directly making a printing plate is attracting public attention, which comprises scanning exposing a printing plate precursor with high convergent radiant rays such as a laser beam carrying digitized image data without using a lith film. With such a tendency, it has become an important technical subject to obtain the printing plate precursor well adapted to this purpose.

Accordingly, simplification of plate-making and the realization of dry system avoiding wet process have been further strongly desired from both aspects of the above-described environmental protection and the adaptation for digitization.

As one example meeting the above demand, a method of making a printing plate is disclosed in JP-A-9-169098 (the term "JP-A" as used herein means an "unexamined published Japanese patent application"), which is a method making use of, in one of non-process type printing plate-making methods, irradiating zirconia ceramic with active light and hydrophilizing the irradiated part. However, the light sensitivity of zirconia is small and light conversion effect from hydrophobicity to hydrophilicity is insufficient, so that discriminating property of an image part from a non-image part is unsatisfactory.

Further, it has been found that the surface of titanium oxide becomes hydrophilic with the irradiation of active light, and simple application of this phenomenon to a printing plate precursor has been suggested. As methods of forming a titanium oxide film, a vapor phase method such as a vacuum deposition method, a chemical deposition method, a sputtering method, and a CVD (chemical vapor deposition) method, a liquid phase method such as a spin coating method and a dipping method, a flame spraying method, and a solid phase method utilizing a solid phase reaction are generally known. Although titanium oxide films produced by these conventionally known methods show image forming property superior to each of the above-described methods, further improvement of the discriminating property of an image part and a non-image part is desired.

Solid state lasers having high output, e.g., a semiconductor laser and a YAG laser are available inexpensively in recent years. As a result, as another producing method of a printing plate by scanning exposure which is easy to be incorporated in a digitized technique, a plate-making method using these lasers as an image-recording means is promising. In conventional plate-making methods, image-recording is performed by imagewise exposing a photosensitive precursor at low to middle degree to cause physical characteristic change of the image on the surface of the precursor by a photochemical reaction. On the other hand, in a method of using the exposure of high power density by a high output laser, a large quantity of light energy is irradiated on an exposure region convergently during a momentary exposure time, the light energy is efficiently converted to heat energy to cause a chemical change, a phase change, or a physical change such as changes of form and structure due to the heat, and that change is utilized in image-recording. That is, image data are inputted by light energy such as laser light, but image-recording is performed by the reaction due to heat energy. In general, this recording system making use of heat generation by high power density exposure is called heat mode recording and converting light energy to heat energy is called light/heat conversion.

A big advantage of a plate-making method utilizing a heat mode recording means is that a material is not sensitive to light of general illuminance level, such as room illumination, and images recorded by high illuminance exposure do not necessitate fixation. That is, when a heat mode material is: used in image-recording, the material is safe to room light before exposure and fixation of the image after exposure is not essential. Accordingly, for example, when an image-recording layer which is insolubilized or solubilized by heat mode exposure is used in a plate-making process of imagewise removing an exposed image-recording layer to make a printing plate by the development-on-machine system, it becomes possible to realize a printing system in which an image is not influenced even when the development (the removal of a non-image part) is exposed to atmospheric light in a room for a certain period of time after image exposure.

Accordingly, if heat mode recording is utilized, it is expected that it will be possible to obtain a lithographic printing plate precursor which is adapted to the development-on-machine system.

As one preferred plate-making method of a lithographic printing plate based on heat mode recording, a method which comprises heat mode exposing a hydrophobic image-recording layer provided on a hydrophilic substrate imagewise to convert the solubility/dispersibility of the hydrophobic layer, and removing a non-image part by wet development, according to necessity, is suggested.

As examples of such plate precursors, JP-B-46-27919 (the term "JP-B" as used herein means an "examined Japanese patent publication") discloses a method of obtaining a printing plate by heat mode-recording a plate precursor comprising a hydrophilic support having provided thereon a recording layer showing so-called positive function, i.e., such function that the solubility is improved by heat, specifically, a recording layer having specific compositions such as saccharides and melamine-formaldehyde resins.

However, any of these recording layers is not sufficient in heat sensitivity, hence the sensitivity to heat mode scanning exposure is extremely unsatisfactory. Further, it is a problem in practical use that the discrimination of hydrophobicity/hydrophilicity, i.e., the change in solubility, before and after exposure is small. If the discrimination is poor, plate-making by the development-on-machine system is difficult in practice.

Methods of plate-making/printing by heat mode image-recording comprising providing a surface layer of a lipophilic metal or an organic sulfur compound on a hydrophilic under layer, and irradiating imagewise the oleophilic layer with a laser beam are disclosed in JP-A-52-37104, JP-A-3-197192 and JP-A-7-1848. These techniques have the advantages of the heat mode plate-making/printing described above, but the heat mode sensitivity to laser beam irradiation is not sufficient yet, and further improvement of the discriminating property of an image part and a non-image part is desired.

Further, some of conventionally used heat mode positive type printing plate precursors are accompanied by a big drawback such as residual films. That is, in a heat mode positive type printing plate precursor, the heat generation by heat mode exposure is based on the light absorption of the light absorbing substance in a recording layer, hence the generated amount of heat is liable to be large on the surface of a recording layer and small in the vicinity of a support. Therefore, the change in solubility of a recording layer by exposure in the vicinity of a support is small and the degree of hydrophilization decreases. As a result, a hydrophobic film is often not removed completely and remains as it is at an exposed part substantially to provide a hydrophilic surface. As such a residual film causes scumming on prints, the improvement of this point is necessary.

Any of the above-described plate-making/printing methods using image-recording by active light irradiation and by heat mode image-recording can directly produce a printing plate from the block copy without using a film. Accordingly, while these methods have advantages that a printing plate can be made on machine and development process can be omitted, they also have drawbacks that the sensitivity is insufficient as described above and the sensitivity differs between the surface and the bottom of an image-recording layer. These defects are basically attributable to the insufficiency of discriminating property of an image part and a non-image part. These defects are also directly linked with the quality of prints and press life. Accordingly, a fundamental means for improving the quality of prints and press life is only to improve the discriminating property of an image part and a non-image part with both plate-making/printing methods using image-recording by active light irradiation and image-recording by heat mode light irradiation.

SUMMARY OF THE INVENTION

Accordingly, an object of the present invention is to provide a lithographic printing plate precursor capable of producing a printing plate having excellent image quality and the sufficient discriminating property of an image part and a non-image part by a simple plate-making method free from an alkaline developing solution.

Another object of the present invention is to solve the above-described problems in the plate-making method using laser beam exposure, i.e., to provide a lithographic printing plate precursor which can be directly loaded on a printer to make a printing plate after scanning exposure for a short time without development process, excellent in press life, and causes less printing scumming on prints.

The present inventors have searched for the materials which show sufficient discriminating property of an image part and a non-image part and have essential characteristics as a printing plate, e.g., adhesion of ink and press life, for achieving the above objects. During the course, the present inventors thought that the means to further conspicuously reveal the change of physical characteristics of a metal compound due to heat was necessary, and looked at the surface properties of the metal compounds of the elements belonging to Group 4 to Group 6 of the Periodic Table. As a result of various examinations, the present invention has been completed.

The present invention has been attained by the following means.

(1) A method for producing a lithographic printing plate which comprises imagewise irradiating a lithographic printing plate precursor with a laser beam to make the irradiated part hydrophilic, wherein the lithographic printing plate precursor comprises a metal compound selected from at least one metal element belonging to Group 4 to Group 6 of the Periodic Table and an oleophilic layer having been provided on the surface thereof.

(2) The effect of the present invention becomes further conspicuous by anodizing the surface of the metal compound of the lithographic printing plate.

(3) The effect of the present invention becomes further conspicuous when the oleophilic layer provided on the surface of the metal compound of the lithographic printing plate is a metal.

(4) It is preferred that the metal which constitutes the oleophilic layer has a melting point of 500° C. or less.

The present invention is based on the constitution having an oleophilic layer the film layer of which can be removed by scattering or by abrasion by irradiating the surface of the metal compound of the element belonging to Group 4 to Group 6 of the Periodic Table with a laser beam. A technique of providing an oleophilic layer on a metal support and imagewise applying the laser beam to the oleophilic layer and recording an image to thereby make a printing plate has been known but, as described above, the sensitivity of recording layers to a laser beam is not necessarily sufficient for market's demand. However, in the case of the metal compounds of the elements belonging to Group 4 to Group 6 of the Periodic Table, it has been found that the heat mode sensitivity to the irradiation of a laser beam to the surface is high, thermal diffusion is less, a highly precise image can be recorded and, further, press life is excellent. In particular, when the surfaces of the metal compounds of the elements belonging to Group 4 to Group 6 have been anodized, the effect is strongly revealed.

By utilizing these characteristics, when the surface of the above-described oleophilic layer, which is substantially a printing ink-receiving oleophilic surface, is imagewise irradiated with active light, the part irradiated with the active light causes abrasion by heat, thereby the hydrophilic surface of the lower film layer of the metal compound is exposed and forms the region to receive a fountain solution, and the oleophilic surface which was not irradiated forms an ink-receiving region, thereby a printing plane can be constituted. As a result, a printing plate which is loadable on a printer as it is without performing development process can be obtained.

That is, an image can be recorded on the thus-obtained lithographic printing plate precursor with sufficient sensitivity by scanning exposure of laser beams, and the plate precursor can be directly loaded on a printer as it is as a printing plate and can start printing without development process, and is also excellent in press life. Thus, the above-described drawbacks of conventional techniques can be solved by the present invention.

In the following description, "the metal compounds of the elements belonging to Group 4 to Group 6 of the Periodic Table" is sometimes called "transition metal compounds according to the present invention" collectively.

DETAILED DESCRIPTION OF THE INVENTION

The present invention will be described in detail below.

Transition Metal Compound Layer According to the Present Invention

"The metal compound of the element belonging to Group 4 to Group 6 of the Periodic Table according to the present invention" is a general term for the compounds of Ti, Zr, Hf, V, Nb, Ta, Cr, Mo and W. Ti, Zr, Nb, Ta and W are particularly preferred among these. "The metal compound" is a general term for oxide, nitride, silicide, boride, and carbide of these compounds, and any compound comprising the combination of these compounds and acid radicals can be used as the metal compound, and not only a single compound but a mixture may be used.

As preferred metallic oxides for use in the present invention, titanium oxide, zirconium oxide, hafnium oxide, vanadium oxide, niobium oxide, tantalum oxide, molybdenum oxide, tungsten oxide and chromium oxide can be exemplified.

Preferred metallic nitrides include titanium nitride, zirconium nitride, hafnium nitride, vanadium nitride, niobium nitride, tantalum nitride, molybdenum nitride, tungsten nitride, and chromium nitride.

Preferred metallic silicides include titanium silicide, zirconium silicide, hafnium silicide, vanadium silicide, niobium silicide, tantalum silicide, molybdenum silicide, tungsten silicide, and chromium silicide, and preferred metallic borides include titanium boride, zirconium boride, hafnium boride, vanadium boride, niobium boride, tantalum boride, molybdenum boride, tungsten boride, and chromium boride.

Preferred metallic carbides include titanium carbide, zirconium carbide, hafnium carbide, vanadium carbide, niobium carbide, tantalum carbide, molybdenum carbide, tungsten carbide, and chromium carbide.

The layers of these metal compounds can be formed by an anodic oxidation method, a deposition method, a CVD method, a sol-gel method, a sputtering method, an ion-plating method, and a diffusion method. Each of the above compounds is commercially available and the commercially available product may be used as a starting material for forming a layer on a substrate according to any of the above layer-forming methods. In electrolytic oxidation, the plate surface of the above compound may be directly electrolytically oxidized. Although it depends on the kind of the compound, the synthesis of the compound and the formation of a layer can be performed simultaneously by introducing each single material constituting the compound into the above-described layer-forming means. In the case of a nitride, the layer of a nitride is formed in a nitrogen atmosphere at high temperature by the above layer-forming means.

In the case of the compound inappropriate to the above layer-forming means, such as a silicon carbide, a layer can be formed by coating or sintering the fine particles of the compound.

Other methods of layer formation will be described in the Example below.

It is preferred to oxidize the surface of a metal by an anodic oxidation method to thereby form a metal oxide layer.

The thickness of the transition metal compound layer is from 0.01 to 10 $\mu$m, preferably from 0.05 to 10 $\mu$m, and more preferably 0.30 $\mu$m or less, for preventing the distortion due to light interference. The layer thickness is preferably 0.01 $\mu$m or more for sufficiently revealing the function of light irradiation.

Method of Anodic Oxidation

Anodic oxidation treatment of the surfaces of the transition metal plates according to the present invention is carried out in the following electrolytic aqueous solutions.

(1) An aqueous solution containing one or more inorganic acids selected from a sulfuric acid, a phosphoric acid, a nitric acid, and a boric acid.

(2) An aqueous solution containing a hydrogen peroxide in addition to the above inorganic acids.

(3) A mixed solution containing inorganic acids in the above (1), in addition, one or more of the alkali metal salts and alkaline earth metal salts thereof.

(4) An aqueous solution containing one or more ammonium salts of the inorganic acids of the above (1), or a solution containing one or more ammonium salts of the inorganic acids of the above (1) and a mixed solution of ethylene glycol and water as a solvent.

(5) An aqueous solution containing one or more organic acids selected from an oxalic acid, a tartaric acid, a citric acid, an acetic acid, a lactic acid, a succinic acid, a glutamic acid, a sulfosalicylic acid, and a naphthalenedisulfonic acid.

(6) An aqueous solution containing one or more alkali metal salts and alkaline earth metal salts of the above organic acids.

(7) An aqueous solution containing one or more ammonium salts of the organic acids of the above (5), or a solution containing one or more ammonium salts of the organic acids of the above (5) and a mixed solution of ethylene glycol and water as a solvent.

(8) An aqueous solution containing one or more selected from the hydroxides of Na, K, Ca, Li and Mg, a water-soluble carbon salt, and an alkaline aqueous solution such as ammonium hydroxide.

(9) An aqueous solution containing at least one of glycerophosphoric acid, the alkali metal salts and alkaline earth metal salts thereof, preferably further containing at least one of an acetic acid, the alkali metal salt and alkaline earth metal salt thereof.

(10) An aqueous solution containing the solution components of the above (1) to (9) in combination.

The concentration of the above electrolytic aqueous solution is determined arbitrarily according to the kind of the electrolyte, and the treatment conditions of the anodic oxidation are selected variously in accordance with the electrolytic aqueous solution selected, but in general the concentration of an electrolyte is from 0.001 to 3 mol/liter, preferably from 0.005 to 1 mol/liter, the temperature of a solution is from 5 to 70° C., preferably from 20 to 50° C., the electric current density is from 1 to 60 A/dm$^2$, preferably from 2 to 10 A/dm$^2$, the voltage is from 1 to 500 V, preferably from 100 to 400 V, and the electrolytic time is from 10 seconds to 10 minutes, preferably from 1 to 5 minutes. Appropriate conditions of the anodic oxidation of representative electrolytic aqueous solutions are described in the Example below.

The thickness of an anodic oxide film is from about 0.001 to about 10 $\mu$m, preferably from 0.1 to 5.0 $\mu$m, and particularly preferably from 0.3 mm to 1.0 $\mu$m.

In some cases, doping a certain kind of metal on the anodized surface is effective, for example, for thermal diffusion. Metals having a small ionization tendency are suitable for this purpose, e.g., Pt, Pd, Au, Ag, Cu, Ni, Fe, and Co are preferably used. These preferred metals may be doped in a plurality.

Pretreatment of Anodic Oxidation

The transition metal plate according to the present invention inclusive of those having a single constitution of a metal plate and those reinforced with a support may be subjected to surface roughening treatment prior to anodic oxidation. By surface roughening treatment, the water receptivity of the surface when hydrophilized can be increased, thereby the discriminating property of an image part and a non-image part can be improved Prior to surface roughening of a metal plate, according to necessity, degreasing treatment for removing the rolling oil on the surface of the plate is conducted with, e.g., a surfactant, an organic solvent or an alkaline aqueous solution.

Surface roughening treatment of a metal plate (a thin layer) can be carried out by various methods, for example, any of a mechanical roughening method, an electrochemical roughening method of dissolving the surface, and a chemical roughening method of selectively dissolving the surface, or combination of these methods can be used. As a mechanical roughening method, well-known methods, e.g., a ball rubbing method, a brush abrading method, a blasting method, or a buffing method, can be used. As an electrochemical roughening method, well-known electrochemical roughening methods of aluminum metal surface, e.g., methods of roughening the surface in a hydrochloric acid or a nitric acid electrolytic solution by alternating current or direct current, can be applied to the surface roughening of the transition metal surface according to the present invention. Further, both methods can be used in combination as disclosed in JP-A-54-63902. Chemical roughening is performed by etching the surface of a metal by immersing a metal plate in a mixed aqueous solution of alkali salts selected from sodium hydroxide, sodium carbonate, sodium silicate, and sodium pyrophosphate.

The thus surface-roughened metal plate is subjected to anodic oxidation treatment as described above. However, the surface roughening of a metal plate is not essential in the present invention.

Lipophilic Layer

The oleophilic layer for use in the lithographic printing plate precursor according to the present invention is not particularly limited so long as it can be removed by scattering, i.e., abrasion, with laser beam irradiation and it is oleophilic. For example, oleophilic metals and oleophilic polymers can be used. The oleophilic layers preferably used in the present invention will be described below.

When oleophilic layers are metal thin film layers, the metals are preferably transition metals, indium, tin, antimony, thallium, tellurium, lead, bismuth, aluminum, potassium, germanium, and alloys of these compounds. As the transition metals, the compounds of arbitrary transition metals such as from scandium to zinc of atomic numbers of 21 to 30, from yttrium to cadmium of atomic numbers of 39 to 48, from hafnium to mercury of atomic numbers of 72 to 80, and lanthanoid series rare earth metals of atomic numbers of 57 to 71 can be used. Further, since zinc, cadmium and mercury generally have many structures which the electron shell may have, there are cases to include them and not to include them in the transition metals, but the present invention includes these elements in the transition metals as they also show the effect of the present invention.

Titanium, zinc, iron, cobalt, nickel, copper, tin, tellurium, indium, vanadium and bismuth are preferably used as the oleophilic metal.

Above all, tin, tellurium, bismuth and zinc each having a melting point of 500° C. or less are particularly preferably used.

The thickness of a metal layer is preferably from 100 Å to 1 $\mu$m, and particularly preferably from 500 Å to 5,000 Å.

As oleophilic layers other than a metal, layers containing (1) an oleophilic and thermoplastic resin, and (2) a substance which converts laser beams to heat may be provided.

Examples of the oleophilic and thermoplastic resins include polyethylene, polypropylene, polyester, polyamide, an acrylic resin, a vinyl chloride resin,a vinylidene chloride resin, a polyvinyl butyral resin, nitrocellulose, polyacrylate, polymethacrylate, polycarbonate, polyurethane, polystyrene, a vinyl chloride resin/vinyl acetate copolymer, a vinyl chloride/vinyl acetate/vinyl alcohol copolymer, a vinyl chloride/vinyl resin/maleic acid copolymer, a vinyl chloride/acrylate copolymer, polyvinylidene chloride, and a vinylidene chloride/acrylonitrile copolymer.

As the substances which can convert laser beams to heat, a carbon simplex such as carbon black and graphite, and dyes, pigments and metals which absorb visible rays, near infrared rays and infrared rays are preferably used. Any of them can be used so long as they have characteristics absorbing the laser beams which are used and converting them to heat energy without emitting phosphorescence.

Examples of the coloring matters in the case where an infrared ray laser is used are described below. Preferred coloring matters are dyes and pigments which have the characteristics of absorbing infrared rays and converting them to heat energy.

Examples of preferred dyes and pigments include a cyanine dye, a squarylium dye, a methine dye, a naphthoquinone dye, a quinoneimine dye, a quinonediimine dye, a pyrylium salt dye, a phthalocyanine dye, a naphthalocyanine dye, a dithiol metal complex dye, an anthraquinone dye, a trisazo dye, an aminium salt dye, a porphyrin pigment, a morpholine pigment, and a phthalocyanine pigment.

Specific examples of the preferred pigments and dyes include Cobalt Green (C.I. 77335), Emerald Green (C.I. 77410), Phthalocyanine Blue (C.I. 74100), Copper Phthalocyanine (C.I. 74160), Ultramarine (C.I. 77007), Prussian Blue (C.I. 77510), Cobalt Violet (C.I. 77360), Paliogen Red 310 (C.I. 71155), Permanent Red BL (C.I. 71137), Perylene Red (C.I. 71140), Rhodamine Lake B (C.I. 45170:2), Helio Bordeaux BL (C.I. 14830), Light Fast Red Toner R (C.I. 12455), Fast Scarlet VD, Lithol Fast Scarlet G (C.I. 12315), Permanent Brown FG (C.I. 12480), Indanthrene Brilliant Orange RK (C.I. 59300), Chromne Orange (C.I. 77601), Hansa Yellow 10 G (C.I. 11710), Titan Yellow (C.I. 77738), Zinc Yellow (C.I. 77955), and Chrome Yellow (C.I. 77600). In addition to these, various kinds of pigments which are used as toners for electrostatic recording are also preferably used.

Other than the above compounds, Malachite Green oxalic acid, quinizarin, 2-(α-naphthyl)-5-phenyloxazole, Oil Pink #312, Oil Green BG, Oil Blue BOS, Oil Black BY, Oil Black BS, Oil Black T-505 (products of Orient Chemical Industry Co., Ltd.), Basic Fuchsine, m-Cresol Purple, cyano-p-diethylaminophenylacetanilide, and dyes disclosed in JP-A-62-293247 and JP-A-9-179290 can be exemplified.

Of these, phthalocyanine complex salts of copper, cobalt, nickel, and iron, e.g., Phthalocyanine Green and Phthalocyanine Blue, and dicarbocyanine and tricarbocyanine dyes represented by 3,3'-ethylmesoethylnaphthathia(oxa) dicarbocyanine and 3,3'-ethylnaphthathia(oxa) tricarbocyanine are preferred.

Support

A variety of forms of supports can be used in the printing plate precursor according to the present invention.

A particularly preferred is the form of a simplex constitution comprising a metal plate in itself as a support and the surface of the metal plate is anodized. The thickness of the metal plate in that case is from about 0.1 to about 0.6 mm, preferably from 0.15 to 0.4 mm, and particularly preferably from 0.2 to 0.3 mm.

As another form, a metal does not serve both as a support, but a metal of thin plate (a thin layer) may be reinforced with an inexpensive metal plate, or a metal plate is provided on the surface of a well flexible metal plate and the surface may be anodized. Preferred metal plates having high intensity, inexpensive and flexible are metal plates of, e.g., aluminum, stainless steel, nickel and copper. A metal thin plate and a metal plate support may be stuck together, or a metal may be vacuum-deposited on a metal plate in thin film layer. The former is economic and simple. In the following description, according to the custom in the industry, when the support is a metal, the support is sometimes described as a substrate but as to the metal, the support and the substrate are the same meaning.

In addition to the above, a metal thin film layer can be provided on a plastic support such as chemically stable and well flexible polyesters and cellulose esters. Further, a metal layer may be provided on a support of waterproofing paper, polyethylene laminated paper, or impregnated paper.

Plastic and paper supports which are preferably used in the present invention include, e.g., paper laminated with polyethylene, polypropylene, or polystyrene, a plastic film such as cellulose diacetate, cellulose triacetate, cellulose propionate, cellulose butyrate, cellulose acetate butyrate, cellulose nitrate, polyethylene terephthalate, polyethylene, polystyrene, polypropylene, polycarbonate, or polyvinyl acetal, and paper or a plastic film laminated or deposited with aluminum.

Of the above, preferred supports are a polyester film, aluminum, and a SUS plate which is corrosive with difficulty on a printing plate. Of these materials, an aluminum plate is particularly preferred because it is dimensionally stable and relatively inexpensive. Preferred aluminum plates are a pure aluminum plate and an aluminum alloy plate comprising aluminum as a main component and a trace amount of different. elements. A plastic film laminated or deposited with aluminum may also be used. Different elements which may be contained in aluminum alloy are silicon, iron, manganese, copper, magnesium, chromium, zinc, bismuth, nickel, titanium, etc. The content of different elements in the aluminum alloy is at most 10% by weight. Particularly preferred aluminum for use in the present invention is pure aluminum but 100% pure aluminum is difficult to produce from the refining technique, accordingly an extremely small amount of different elements may be contained. The composition of aluminum plates used in the present invention are not specified, and aluminum plates made of materials conventionally well-known and commonly used can be used arbitrarily.

When an anodized transition metal plate is used as a support, the metal support may be treated by well-known surface roughening methods. Surface roughening treatment may be carried out by any method, such as a mechanical roughening method, an electrochemical roughening method, and a chemical etching method, or combination of these methods can be used. By surface roughening treatment of the support, the water receptivity of the anodized transition metal film provided on the support is sometimes increased. A surface roughened preferred metal support is an aluminum support.

When a metal support is provided different from the transition metal plate, the thickness of the support is from about 0.06 to about 0.6 mm, preferably from 0.1 to 0.4 mm, and particularly preferably from 0.1 to 0.3 mm, and the thickness of the transition metal thin film layer is from 0.001 to 0.1 mm or so, preferably from 0.005 to 0.05 mm, and particularly preferably from 0.01 to 0.05 mm.

Plate-Making

The surface of the printing plate precursor of the present invention comprising an anodized transition metal plate having provided thereon an oleophilic layer is originally oleophilic and ink-receptive, but when the printing plate precursor is imagewise irradiated with active light, the irradiated part causes abrasion, thus the irradiated part of the surface of the lower anodized transition metal layer becomes hydrophilic and ink-repellent. Accordingly, when the imagewise exposed printing plate precursor is brought into contact with lithographic printing ink, the printing plane comprising the fountain solution-retaining non-image part and the ink-receiving image part is formed, and printing is performed by bringing the printing plane into contact with a plane to be printed to transfer the ink thereto.

Light Irradiation

In the present invention, the active light which excites the anodized metal thin film may be the light from any light source so long as the light has the sensitivity within the sensitivity region of the thin film. For example, the sensitivity region of the anatase type titanium oxide is 387 nm or less and that of the rutile type is 413 nm or less, similarly the sensitivity region of an anodized titanium film is 420 nm or less, therefore, a mercury lamp, a tungsten halogen lamp, other metal halide lamps, a xenon lamp, and a carbon arc lamp can be preferably used.

Moreover, as an excitation light source, a helium cadmium laser having oscillation wavelength at 325 nm and a water-cooled argon laser having oscillation wavelength at 351.1 to 363.8 nm can also be used. Further, a zinc sulfide laser having oscillation wavelength at 330 nm, a zinc sulfide laser having oscillation wavelength at 370 nm, and a zinc sulfide/cadmium laser having at 330 to 440 nm, in which near ultraviolet oscillation has been confirmed, can also be applied.

An Nd/YAG laser having a wavelength of 1,064 nm can also be used. Above all, an Nd/YAG laser equipped with Q switch and engineeringly pumped by pulse oscillation with a krypton mark lamp is preferred. When an image is formed on an anodized titanium film, irradiation is preferably performed with laserbeams having peak output of 1,000 W, preferably 2,000 W.

Besides the above, a semiconductor laser, such as GaAs, GaP, PbS, and PbSe, an eximer laser, such as ArF, KrF, xEcL, and XeF, and a helium-neon laser can also be used.

As the preferred intensity of irradiation light varies according to the wavelength of light, but generally surface exposure strength before modulation by the image to be printed is preferably from 0.05 to 100 joule/cm$^2$, more preferably from 0.2 to 10 joule/cm$^2$, and particularly preferably from 0.5 to 5 joule/cm$^2$.

When the image exposure is such strong irradiation as is accompanied by scattering and removal of an image-forming layer, which is called abrasion, it is preferred to perform scanning on the printing plate precursor using laser light sources containing a large amount of infrared ray components with modulating the laser beams by the image, but even with a visible ray laser, if irradiation is such that the light absorbing material efficiently absorbs light, light/heat conversion is brought about. Examples of laser light sources include a semiconductor laser, a helium-neon laser, a helium-cadmium laser, and a YAG laser. Irradiation can be performed with laser beams having output of from 0.1 to 300 W. When a pulse laser is used, irradiation is preferably performed with laser beams having peak output of 1,000 W, preferably 2,000 W. In this case, exposure amount is preferably in surface exposure strength before modulation by printing image of from 0.1 to 10 joule/cm$^2$, more preferably from 0.3 to 1 joule/cm$^2$.

The above photosensitivity is different from the photosensitivity of the zirconia ceramic described above as a conventional technique (disclosed in JP-A-9-169098). For example, as to the sensitivity, there is disclosed in the above patent that laser beams of 7 W/$\mu$m$^2$ are used for the zirconia ceramic, which corresponds to 70 joule/cm$^2$ taking the pulse duration of the laser beams as 100 nanoseconds. As compared with the sensitivity of the anodized titanium oxide film, the sensitivity of the zirconia ceramic is lower than that of the titanium oxide film by a figure or more. Also, as compared with the above-described conventional plate-making/printing methods (disclosed in JP-A-52-37104, JP-A-3-197192, and JP-A-7-1848) comprising providing a surface layer of an oleophilic metal or organic sulfur compound on a hydrophilic lower layer, imagewise irradiating the oleophilic layer with laser beams and performing image-recording by heat mode, the heat mode sensitivity to laser irradiation of the present invention is higher, which contributes to the high discriminating property of an image part and a non-image part.

Printing Process

After imagewise printing exposure of the surface of the printing plate precursor according to the present invention comprising an anodized transition metal plate having provided thereon an oleophilic layer, the printing plate precursor can be sent to lithographic printing process as it is without development processing.

Accordingly, the lithographic printing method according to the present invention has various advantages represented by simplicity as compared with well-known lithographic printing methods. That is, as described above, chemical treatment with an alkaline developing solution is not necessary, as a result, accompanied operations such as wiping and brushing are not necessary, and further, the increase in environmental load due to discard of developing waste solutions does not follow.

The exposed area of the thus-obtained lithographic printing plate has been sufficiently hydrophilized but, if desired, it may be subjected to post-treatment using washing water, a rinsing solution containing a surfactant and the. like, and a desensitizing solution containing gum arabic and starch derivatives. When the image-recording material according to the present invention is used as a printing material, these treatments can be used in various combinations as post-treatment.

As such a method, a method of coating on the lithographic printing plate using sponge or absorbent cotton impregnated with the plate burning conditioner, or a method of coating by immersing the printing plate in a vat filled with the plate-burning conditioner, or a method of coating using an automatic coater can be applied. Making the coating amount of the solution even using a squeegee or a squeegee roller after coating gives a preferred result. The coating amount of the plate burning conditioner is generally appropriately from 0.03 to 0.8 g/m$^2$ (in dry weight).

The lithographic printing plate obtained through these treatments is set in a lithographic printer and used for printing of a large number of sheets.

EXAMPLES

The present invention will be described in detail below with reference to the examples, but the present invention should not be construed as being limited thereto.

EXAMPLES 1 TO 28 AND COMPARATIVE EXAMPLES 1 TO 3

In Example 1, substrate (A) was prepared by anodizing a commercially available titanium plate having a thickness of 0.2 mm using a mixed solution of 0.005 mol/liter of sodium glycerophosphate and 0.09 mol/liter of strontium acetate at 40° C. by electric current density of 5 A/dm$^2$ and applying direct current to the plate for 4 minutes, the plate was then washed and dried. Then, tin was vacuum-deposited on substrate (A) in a thickness of 500 Å using a vacuum deposition apparatus manufactured by JEOL, Ltd., thus lithographic printing plate precursor (A-1) was prepared. This printing plate precursor (A-1) was irradiated with a YAG laser on the following condition.

Laser power: 0.7 W

Beam radius: 45 $\mu$m

Scanning speed: 1.2 m/sec

Evaluation of Printability

Lithographic printing plate precursor (A-1) having the image formed by laser irradiation was loaded on a printer without performing post-treatment and printing was performed. Printing was performed by using AURELIA 125 Single Colour Sheet-fed Offset Press (sheet size: 19 inch×25 inch) (manufactured by Harris Corporation) as a printer, Geos sumi (manufactured-by Dainippon Chemicals and Ink Co., Ltd.) as ink, a mixture comprising 90 vol % of EU-3 (manufactured by Fuji Photo Film Co., Ltd.) diluted with water to 1/100 and 10 vol % of isopropanol as a fountain solution, and high quality paper. As a result, no scumming was generated on the part irradiated with laser beams, adhesion of ink to the non-irradiated part was satisfactory, and 30,000 sheets of clear prints could be printed.

Evaluation of Scumming

Rate for removal of ink attached to the non-image area was evaluated with the following ratings:

○: Rate for removal of ink attached to the non-image area is fast

Δ: Rate for removal of ink attached to the non-image area is slower than that of rating ○, but is faster than that of rating X X: Rate for removal of ink attached to the non-image area is very slow Evaluation of Inking Inking rate to obtain a clear printing image was evaluated with the following ratings:

○: Inking rate is fast

Δ: Inking rate is slower than that of rating ○, but is faster than that of rating X X: Inking rate is slow In Example 2, printing plate precursor (A-2) was prepared in the same manner as in Example 1 except that chromium was deposited in a thickness of 1,000 Å in place of tin. The printing plate precursor was irradiated with a YAG laser in the same manner as in Example 1 and printing was performed. As a result, 30,000 sheets of clear prints could be obtained.

In Example 3, printing plate precursor (A-3) was prepared in the same manner as in Example 2 except that titanium was deposited in place of chromium. The printing plate precursor was irradiated with a YAG laser in the same manner as in Example 1 and printing was performed. As a result, 30,000 sheets of clear prints could be obtained.

In Example 4, printing plate precursor (A-4) was prepared in the same manner as in Example 2 except that iron was deposited in place of chromium. The printing plate precursor was irradiated with a YAG laser in the same manner as in Example 1 and printing was performed. As a result, 30,000 sheets of clear prints could be obtained.

In Example 5, printing plate precursor (A-5) was prepared in the same manner as in Example 2 except that zinc was deposited in place of chromium. The printing plate precursor was irradiated with a YAG laser in the same manner as in Example 1 and printing was performed. As a result, 30,000 sheets of clear prints could be obtained.

In Example 6, printing plate precursor (A-6) was prepared in the same manner as in Example 2 except that graphite was deposited in place of chromium. The printing plate precursor was irradiated with a YAG laser in the same manner as in Example 1 and printing was performed. As a result, 30,000 sheets of clear prints could be obtained.

In Example 7, printing plate precursor (A-7) was prepared in the same manner as in Example 2 except that nickel was deposited in place of chromium. The printing plate precursor was irradiated with a YAG laser in the same manner as in Example 1 and printing was performed. As a result, 30,000 sheets of clear prints could be obtained.

In Example 8, printing plate precursor (A-8) was prepared in the same manner as in Example 2 except that tellurium was deposited in place of chromium. The printing plate precursor was irradiated with a YAG laser in the same manner as in Example 1 and printing was performed. As a result, 30,000 sheets of clear prints could be obtained.

In Example 9, printing plate precursor (A-9) was prepared in the same manner as in Example 2 except that copper was deposited in place of chromium. The printing plate precursor was irradiated with a YAG laser in the same manner as in Example 1 and printing was performed. As a result, 30,000 sheets of clear prints could be obtained.

In Example 10, printing plate precursor (A-10) was prepared in the same manner as in Example 2 except-that silver was deposited in place of chromium. The printing plate precursor was irradiated with a YAG laser in the same manner as in Example 1 and printing was performed. As a result, 30,000 sheets of clear prints could be obtained.

In Example 11, substrate (B) was prepared by anodizing a commercially available zirconium plate having a thickness of 0.2 mm using 100 g/liter of a sulfuric acid solution at 30° C. by electric current density of 5 A/dm$^2$ and applying direct current to the plate for 90 seconds, the plate was then washed and dried. Tin was vacuum-deposited on substrate (B) in a thickness of 600 Å in the same manner as in Example 1, thus lithographic printing plate precursor (B-1) was prepared. This printing plate precursor (A-1) was irradiated with a YAG laser in the same manner as in Example 1 and printing was performed. As a result, 30,000 sheets of clear prints could be obtained.

In Example 12, substrate (C) was prepared by anodizing a commercially available tantalum plate using a mixed solution of 0.005 mol/liter of sodium glycerophosphate and 0.09 mol/liter of strontium acetate at 40° C. by electric current density of 5 A/dm$^2$ and applying direct current to the plate for 4 minutes, the plate was then washed and dried. Titanium was vacuum-deposited on substrate (C) in the same manner as in Example 3, thus lithographic printing plate precursor (C-1) was prepared. The printing plate precursor was irradiated with a YAG laser in the same manner as in Example 1 and printing was performed. As a result, 30,000 sheets of clear prints could be obtained.

In Example 13, printing plate precursor (C-2) was prepared in the same manner as in Example 12 except that nickel was deposited in place of titanium. The printing plate precursor was irradiated with a YAG laser in the same manner as in Example 1 and printing was performed. As a result, 30,000 sheets of clear prints could be obtained.

In Example 14, printing plate precursor (C-3) was prepared in the same manner as in Example 12 except that vanadium was deposited in place of titanium. The printing plate precursor was irradiated with a YAG laser in the same manner as in Example 1 and printing was performed. As a result, 30,000 sheets of clear prints could be obtained.

In Example 15, printing plate precursor (C-4) was prepared in the same manner as in Example 12 except that chromium was deposited in place of titanium. The printing plate precursor was irradiated with a YAG laser in the same manner as in Example 1 and printing was performed. As a result, 20,000 sheets of clear prints could be obtained.

In Example 16, printing plate precursor (C-5) was prepared in the same manner as in Example 1 except that tin was vacuum deposited in a thickness of 5,000 Å. The printing plate precursor was irradiated with a YAG laser in the same manner as in Example 1 and printing was performed. As a result, 20,000 sheets of clear prints could be obtained.

In Example 17, printing plate precursor (C-6) was prepared by vacuum-depositing iron in the same manner as in Example 4. The printing plate precursor was irradiated with a YAG laser in the same manner as in Example 1 and printing was performed. As a result, 20,000 sheets of clear prints could be obtained.

In Example 18, substrate (D) was prepared by anodizing a commercially available tungsten plate using 100 g/liter of a sulfuric acid solution at 30° C. by electric current density of 5 A/dm$^2$ and applying direct current to the plate for 90 seconds, the plate was then washed and-dried. Titanium was vacuum-deposited on substrate (D) in the same manner as in Example 3, thus lithographic printing plate precursor (D-1) was prepared. This printing plate precursor (D-1) was irradiated with a YAG laser in the same manner as in Example 1 and printing was performed. As a result, 10,000 sheets of clear prints could be obtained.

In Example 19, substrate (E) was prepared by anodizing a commercially available niobium using, as the electrolytic solution, a solution comprising 0.2 mol of ammonium borate and 600 g of ethylene glycol dissolved in 400 g of water at 25° C. by electric current density of 5 A/dm$^2$ and applying direct current to the plate for 30 seconds, the plate was then washed and dried. Tin was vacuum-deposited on substrate (E) in the same manner as in Example 16, thus substrate (E-1) was prepared. Substrate (E-1) was irradiated with a YAG laser in the same manner as in Example 1 and printing was performed. As a result, 30,000 sheets of clear prints could be obtained.

In Example 20, chromium was vacuum-deposited on substrate (E) in the same manner as in Example 2, thus substrate (E-2) was prepared. Substrate (E-2) was irradiated with a YAG laser in the same manner as in Example 1 and printing was performed. As a result, 30,000 sheets of clear prints could be obtained.

In Example 21, a substrate was formed by a reactive sputtering method. Titanium nitride layer having a thickness of 500 Å was formed in argon/nitrogen atmosphere (in the ratio of 50/50) on a stainless steel substrate having a thickness of 0.2 mm. Tin was vacuum-deposited in the same manner as in Example 1, thereby substrate (F-1) was prepared. The substrate was irradiated with a YAG laser in the same manner as in Example 1 and printing was performed. As a result, 30,000 sheets of clear prints could be obtained.

In Example 22, titanium carbide was formed on a commercially available stainless steel plate having a thickness of 0.2 mm from titanium chloride, methane gas, argon and hydrogen gas. Titanium was vacuum-deposited on the titanium carbide in the same manner as in Example 3, thereby substrate (F-2) was prepared. The substrate was irradiated with a YAG laser in the same manner as in Example 1 and printing was performed. As a result, 30,000 sheets of clear prints could be obtained.

In Example 23, tungsten carbide was prepared by carbonization treatment of a commercially available tungsten substrate having a thickness of 0.2 mm. Titanium was vacuum-deposited on the tungsten carbide in the same manner as in Example 3, thereby substrate (F-3) was prepared. The substrate was irradiated with a YAG laser in the same manner as in Example 1 and printing was performed. As a result, 30,000 sheets of clear prints could be obtained.

In Example 24, a commercially available vanadium was treated by heating at 700° C. in the air, and then titanium was vacuum-deposited on the heat-treated vanadium in the same manner as in Example 3, thereby substrate (F-4) was prepared. The substrate was irradiated with a YAG laser in the same manner as in Example 1 and printing was performed. As a result, 30,000 sheets of clear prints could be obtained.

In Example 25, a commercially available titanium plate having a thickness of 0.2 mm was treated with boron chloride and hydrogen gas to prepare titanium boride, and then titanium was vacuum-deposited on the titanium boride in the same manner as in Example 3, thereby substrate (F-5) was prepared. The substrate was irradiated with a YAG laser in the same manner as in Example 1 and printing was performed. As a result, 30,000 sheets of clear prints could be obtained.

In Example 26, a commercially available zirconium plate having a thickness of 0.2 mm was treated with boron chloride and hydrogen gas to prepare zirconium boride, and then titanium was vacuum-deposited on the zirconium boride in the same manner as in Example 3, thereby substrate (F-6) was prepared. The substrate was irradiated with a YAG laser in the same manner as in Example 1 and printing was performed. As a result, 30,000 sheets of clear prints could be obtained.

In Example 27, a commercially available molybdenum plate having a thickness of 0.2 mm was subjected to silicification treatment with silicon chloride and hydrogen gas to prepare molybdenum silicide, and then titanium was vacuum-deposited on the molybdenum silicide in the same manner as in Example 3, thereby substrate (F-7) was prepared. The substrate was irradiated with a YAG laser in the same manner as in Example 1 and printing was performed. As a result, 30,000 sheets of clear prints could be obtained.

In Example 28, substrate (G) was prepared by anodizing hafnium using 100 g/liter of a sulfuric acid solution at 30° C. by electric current density of 5 A/dm$^2$ and applying direct current to the plate for 90 seconds, the plate was then washed and dried. Iron was vacuum-deposited on substrate (G) in the same manner as in Example 4, thus substrate (G-1) was prepared. Substrate (G-1) was irradiated with a YAG laser in the same manner as in Example 1 and printing was performed. As a result, 30,000 sheets of clear prints could be obtained.

In Example 29, substrate (A) was prepared in the same manner as in Example 1, and photosensitive solution A shown below was coated on substrate (A) in a dry thickness of 1 $\mu$m. The coated substrate (A) was then irradiated with a YAG laser in the same manner as in Example 1 and printing was performed. As a result, 20,000 sheets of clear prints could be obtained.

Photosensitive Solution A

Behenic acid (49 weight parts), styrene resin (49 weight parts, manufactured by Esso Standard Petroleum Co., Ltd.) and Phthalocyanine Blue (2 weight parts, a commercially available product) were dissolved in tetrahydrofuran. The thus-obtained solution was designated photosensitive solution A.

In Comparative Example 1, substrate (H) was prepared by anodizing commercially available aluminum plate having a thickness of 0.2 mm using 100 g/liter of a sulfuric acid solution at 30° C. by electric current density of 5 A/dm$^2$ and applying direct current to the plate for 90 seconds, the plate was then washed and dried. Copper was vacuum-deposited on substrate (H) in the same manner as in Example 9, thus substrate (H-1) was prepared. Substrate (H-1) was subjected to irradiation with a YAG laser but image could not form on the same condition as in Example 1.

In Comparative Example 2, substrate (H) was prepared in the same manner as in Comparative Example 1 and silver was vacuum-deposited on substrate (H) in the same manner as in Example 10, thereby substrate (H-2) was prepared. Substrate (H-2) was subjected to irradiation with a YAG laser but image could not form on the same condition as in Example 1. Printing was performed but ink adhered to the entire surface of the print and a non-image part could not be obtained.

In Comparative Example 3, substrate (A) prepared in the same manner as in Example 1 was subjected to irradiation with a YAG laser on the same condition as in Example 1 but image could not form. Further, when printing was performed, ink could not adhere to the print.

The results of the above tests are summarized in Table 1 below.

TABLE 1

| Test | Metal Compound from Group 4 to Group 6 | Upper Layer | Scumming | Inking | Number of Printed Sheets |
|---|---|---|---|---|---|
| Example 1 | Titanium oxide | Tin | ○ | ○ | 30,000 |
| Example 2 | Titanium oxide | Chromium | ○ | ○ | 30,000 |
| Example 3 | Titanium oxide | Titanium | ○ | ○ | 30,000 |
| Example 4 | Titanium oxide | Iron | ○ | ○ | 30,000 |
| Example 5 | Titanium oxide | Zinc | ○ | ○ | 30,000 |
| Example 6 | Titanium oxide | Graphite | ○ | Δ | 30,000 |
| Example 7 | Titanium oxide | Zinc | ○ | ○ | 30,000 |
| Example 8 | Titanium oxide | Tellurium | ○ | ○ | 30,000 |
| Example 9 | Titanium oxide | Copper | ○ | ○ | 30,000 |
| Example 10 | Titanium oxide | Silver | ○ | ○ | 30,000 |
| Example 11 | Zirconium oxide | Tin | Δ | ○ | 30,000 |
| Example 12 | Tantalum oxide | Titanium | Δ | ○ | 30,000 |
| Example 13 | Tantalum oxide | Nickel | ○ | ○ | 30,000 |
| Example 14 | Tantalum oxide | Vanadium | ○ | ○ | 30,000 |
| Example 15 | Tantalum oxide | Chromium | ○ | ○ | 20,000 |
| Example 16 | Tantalum oxide | Tin | ○ | ○ | 20,000 |
| Example 17 | Tantalum oxide | Iron | ○ | ○ | 20,000 |
| Example 18 | Tungsten oxide | Titanium | ○ | ○ | 10,000 |
| Example 19 | Niobium oxide | Tin | ○ | ○ | 30,000 |
| Example 20 | Niobium oxide | Chromium | ○ | ○ | 30,000 |
| Example 21 | Titanium nitride | Tin | ○ | ○ | 30,000 |
| Example 22 | Titanium carbide | Tin | ○ | ○ | 30,000 |
| Example 23 | Tungsten carbide | Tin | ○ | ○ | 30,000 |
| Example 24 | Vanadium carbide | Tin | ○ | ○ | 30,000 |
| Example 25 | Titanium boride | Tin | ○ | ○ | 30,000 |
| Example 26 | Zirconium boride | Tin | ○ | ○ | 30,000 |
| Example 27 | Molybdenum silicide | Tin | ○ | ○ | 30,000 |
| Example 28 | Hafnium oxide | Iron | ○ | ○ | 30,000 |
| Example 29 | Titanium oxide | Photosensitive Layer A | ○ | ○ | 20,000 |
| Comparative Example 1 | Aluminum oxide | Copper | X | ○ | — |
| Comparative Example 2 | Aluminum oxide | Silver | X | ○ | — |
| Comparative Example 3 | Titanium oxide | None | ○ | X | — |

As is apparent from the results in Table 1, satisfactory results could be obtained in the point of printing scumming, inking property and press life, respectively, of each sample of the lithographic printing plate precursors according to the present invention, while each comparative lithographic printing plate precursor was unsatisfactory in some property or other.

As described above, due to the constitution of the lithographic printing plate precursor according to the present invention comprising an anodized metal compound belonging to Group 4 to Group 6 of the Periodic Table and an oleophilic layer capable of abrasion by laser exposure having been provided on the surface of the anodized metal compound, a lithographic printing image plate in which the non-exposed part becomes ink-receptive only by imagewise exposure with active light can be formed, and a lithographic printing image plane in which the irradiated part becomes ink-repellent by the abrasion due to imagewise irradiation with laser beams can be formed. Either system requires no developing solution and makes possible lithographic printing with maintaining clear printing plane. Further, it is also possible to perform plate-making-on-machine according to the present invention.

In addition, the present invention can provide a lithographic printing plate precursor which is free from scumming, and excellent in inking property and press life (printing durability).

While the invention has been described in detail and with reference to specific embodiments thereof, it will be apparent to one skilled in the art that various changes and modifications can be made therein without departing from the spirit and scope thereof.

What is claimed is:

1. A method for producing a lithographic printing plate which comprises imagewise irradiating a lithographic printing plate precursor with a laser beam to make the irradiated part hydrophilic, wherein said lithographic printing plate precursor comprises a metal compound selected from at least one metal element belonging to Group 4 to Group 6 of the Periodic Table wherein the surface of the metal compound is anodized and an oleophilic metal layer provided on the surface thereof.

2. The method for producing a lithographic printing plate according to claim 1, wherein the metal layer has a thickness of from 100 Å to 1 $\mu$m.

3. A method for producing a lithographic printing plate which comprises imagewise irradiating a lithographic printing plate precursor with a laser beam to make the irradiated part hydrophilic, wherein said lithographic printing plate precursor comprises a metal compound selected from at least one metal element belonging to Group 4 to Group 6 of the Periodic Table wherein the surface of the metal compound is anodized and an oleophilic layer selected from the group consisting of tin, tellurium, bismuth and zinc provided on the surface thereof.

* * * * *